United States Patent [19]

Schlegel

[11] 3,975,758
[45] Aug. 17, 1976

[54] GATE ASSIST TURN-OFF, AMPLIFYING GATE THYRISTOR AND A PACKAGE ASSEMBLY THEREFOR

[75] Inventor: Earl S. Schlegel, Pittsburgh, Pa.

[73] Assignee: Westinghouse Electric Corporation, Pittsburgh, Pa.

[22] Filed: May 27, 1975

[21] Appl. No.: 581,256

[52] U.S. Cl. .................................. 357/74; 357/38; 357/75; 357/76; 357/81; 357/79
[51] Int. Cl.² .................. H01L 23/02; H01L 23/12; H01L 29/74; H01L 23/32
[58] Field of Search ................... 357/38, 74, 75, 76, 357/81, 79

[56] References Cited
UNITED STATES PATENTS

| | | | |
|---|---|---|---|
| 3,619,731 | 11/1971 | Baker | 357/75 |
| 3,654,529 | 4/1972 | Lord | 357/79 |
| 3,708,732 | 1/1973 | Faust | 357/75 |
| 3,846,823 | 11/1974 | Matthews | 357/79 |

*Primary Examiner*—Andrew J. James
*Attorney, Agent, or Firm*—C. L. Menzemer

[57] ABSTRACT

A conventional amplifying gate thyristor is provided with gate assist turn-off capability by a package assembly. The package assembly comprises an encapsulation means adapted for packaging therein the amplifying gate thyristor, said encapsulation means including a locator means for aligning and supporting a gate contact adapted to make ohmic contact with a gate electrode of the amplifying gate thyristor and for aligning and supporting a diode relative to said gate electrode. A diode is disposed in a semiconductor body having cathode and anode regions forming a PN junction therebetween and adjoining opposed major surfaces of said semiconductor body, respectively. The diode is fastened to said locator means with said cathode region thereof making ohmic contact with said gate contact and said anode region thereof making ohmic contact with an anode electrode affixed on a major surface of said semiconductor body and adapted to make ohmic contact with a floating electrode of the amplifying gate thyristor.

2 Claims, 3 Drawing Figures

GATE ASSIST TURN-OFF, AMPLIFYING GATE THYRISTOR AND A PACKAGE ASSEMBLY THEREFOR

FIELD OF THE INVENTION

The present invention relates to semiconductor devices and particularly amplifying gate thyristors having gate assisted turn-off capability.

BACKGROUND OF THE INVENTION

Thyristors are nonlinear, solid state devices that are bistable. That is, they have both a high impedance state and a low impedance state. For this reason, thyristors are generally used as solid state switches. Thyristors commonly have four-layer PNPN semiconductor structures, with two intermediate regions called cathode-base and anode-base regions, and two extremity regions adjoining major surfaces of a semiconductor body called cathode-emitter and anode-emitter regions. Thyristors are usually gated or switched from a high impedance blocking state to a low impedance conducting state by applying through a gate electrode a positive electrical control signal to the cathode-base region of the device.

In operation, a positive control signal forward biases the PN junction (cathode junction) between the cathode-emitter and cathode-base regions and causes electron injection into the cathode-base region in the vicinity of the reverse biased, forward blocking center PN junction between the cathode-base and anode-base regions. The injected electrons are swept across the depletion layer at the forward blocking junction, causing an anode-to-cathode electric current and increasing the current gain ($\alpha$'s) of the PNP and NPN transistor equivalents of the structure. If the positive control signal is high enough, the sum of the gains ($\alpha s$) of the NPN and PNP structure equal unity in some portion or filament, and the device will switch the thyristor from the high impedance, blocking state to the low impedance, conducting state. The thyristor will thereafter remain in the conducting state so long as the current through the thyristor exceeds the holding current of the device.

A major restriction on power thyristors has been the $dI/dt$ capability, i.e. the rate of current increase or "turn-on" as a function of time. The difficulty is that only a small portion of the device is responsive to the control signal and initially switches to the conducting state. The device is dependent upon carrier diffusion to turn-on the remainder of the active regions, which diffusion requires substantial time. Initially, on turn-on, the anode-to-cathode voltage drops instantaneously to about 10% of the blocking state value, and the current is conducted through the portions or filaments of the device in the conducting state, causing a very high current density and localized heating and degrading of the device. To avoid such degradation and possible failure of the thyristor, the external circuit typically requires an inductance to limit the current rise on switching of the thyristor, which causes power losses and generally limits the performance of the circuit.

Amplifying gate thyristors, such as the one shown in FIG. 1, have been developed to provide improved $dI/dt$ capability in power thyristors and to reduce the current carrying requirements of the gate curcuit. An auxiliary or pilot thyristor 2 of annular shape is provided preferably centrally of the main thyristor 1 in the same semiconductor body. Pilot thyristor 2 and main thyristor 1 have their anode-emitter, anode-base and cathode-base regions 3, 4 and 5 in common, and the cathode-emitter regions 6 and 7 of the pilot and main thyristors are spaced adjacent each other along the same major surface of the semiconductor body. A gate electrode 8 is provided adjacent and preferably centrally of the pilot thyristor opposite from the main thyristor, and a floating electrode 9 is provided on the major surface of the semiconductor body astride the PN junction between the cathode-emitter and cathode-base regions of pilot thyristor 2.

Pilot thyristor 2 is turned-on by a control signal applied to gate electrode 8 which flows laterally into pilot thyristor 2 as shown by arrows 10, forward biasing the cathode junction between the cathode-emitter and cathode-base regions 5 and 6, and turning-on the pilot thyristor 2 from the inner edge of the cathode-emitter where the gate current is injected. The resulting anode current as shown by arrows 11 through the pilot thyristor 2 is utilized as a gate current to turn-on main thyristor 1. The anode current from pilot thyristor 2 flows through floating contact 9 and cathode-base region 5 to the cathode shunts 12 along the inner edge of cathode-emitter region 7 of main thyristor 1 as shown by arrows 13. A substantial portion of the main thyristor, particularly if the structure is interdigitated, can thus be initially switched to the conducting state. Such amplifying thyristors can be utilized to rapidly switch high power without substantial power losses. Cathode shunts 12 also provide increase dV/dt capability by conducting anode current without forward biasing the cathode junction and producing a lateral current flow that more rapidly forward biases the cathode junction.

Thyristors are also notorious for their long turn-off times. That is, the time required to establish the high impedance, blocking state in the thyristor on switching from the low impedance, conducting state. In a simple thyristor structure, the blocking state can be restored only by reducing the anode-to-cathode current to below the holding current for such a time period to allow the depletion layer to be reformed at the forward blocking center junction when forward voltage is reapplied. The turn-off time is thus directly related to the diffusion time of the carriers, both electrons and holes, across the base regions and to the carrier lifetimes within the base regions.

Where rapid turn-off capability has been needed, an interdigitated gate electrode structure has been provided with the cathode-emitter region and cathode electrode. A negative control signal is applied to the interdigitated gate electrode(s) to cause a current flow from the cathode electrode and reverse bias the cathode junction between the cathode-base and cathode-emitter regions. The current density in the device can thus be counteracted after rapid reduction of the load current to zero to avoid refiring of the device by rapid reapplication of the load potential, e.g. in high frequency operation of 10 to 20 KHz. Or, the high impedance blocking state can thus be reestablished in the thyristor while a load current is still applied to the device under low frequency or DC load potentials. Thyristors operated in the former mode are commonly called "Gate Assisted Turn-Off Thyristors" or "GATTs"; and thyristors operated in the latter mode are commonly called "Gate Controlled Switches" or "GCSs".

Fast switching power thyristors operated in either the GATT or GCS mode need both gate amplification for fast, low power loss turn-on, and gate assist for fast, low power loss turn-off. However, conventional available amplifying gate thyristors cannot provide both fast turn-on and fast turn-off. In order to perform both fast turn-on and fast turn-off functions in a single device, separate gate electrodes are typically needed for turn-on and turn-off. The two gates are required because amplifying gates have a high lateral resistance (e.g. 10–25 ohms) in the direction in which current must flow during turn-off. The current for turn-off is of opposite polarity from the gate current for turn-on, and the cathode junction between the cathode-emitter and cathode-base of the pilot thyristor is reverse biased. The current must, therefore, flow laterally through cathode-base region 5 under cathode-emitter region 6 to reach gate electrode 8. The resulting high resistance greatly reduces the effectiveness of the gate turn-off current and in turn degrades the performance of the device. In addition, degradation and failure of the device may occur dure to nonuniform avalanche of the cathode junction between the cathode-emitter and cathode-base regions of the pilot thyristor 2.

Accordingly, a second separate gate is provided for turn-off through which the gate assist current can be shunted to bypass the pilot thyristor. A diode 14 is provided to establish a low resistance path through the second gate bypassing the pilot thyristor in the turn-off mode and, on the other hand, to block gate current from bypassing the pilot thyristor in the turn-on mode. The diode is typically fused to the floating electrode as shown in FIG. 1, which doubles as the separate turn-off gate. The fusion of diode 14 to the floating electrode is deemed necessary to properly align the diode and provide a low resistance path for turn-off. Additional fabrication steps were therefore needed to provide a special thyristor which had both fast turn-on and fast turn-off capability, and special encapsulation and packaging assemblies were needed for such devices.

The present invention overcomes these difficulties and disadvantages and provides a power thyristor with both fast turn-on and turn-off capabilities utilizing a conventional amplifying gate thyristor. A simple, low cost means is provided to adapt existing amplifying gate thyristors and packaging assemblies to provide both gate amplification on turn-on and GATT or GSC modes on turn-off.

SUMMARY OF THE INVENTION

A gate assist turn-off, amplifying gate thyristor is made utilizing a conventional, commercially available amplifying gate thyristor with a package assembly therefor. The package assembly may be adapted from existing package assemblies by replacing certain parts to provide an amplifying gate thyristor with gate assist turn-off capability in a simple, low cost way.

The amplifying gate thyristor is disposed in a first semiconductor body having first and second major surfaces. First, second, third and fourth impurity regions of alternate conductivity-type are disposed through the semiconductor body from the first major surface to the second major surface to form PN junctions between adjacent regions. Said first, second, third and fourth impurity regions form main cathode-emitter, cathode-base, anode-base, and anode-emitter regions, respectively, of the main thyristor of the amplifying gate thyristor. Also disposed in first semiconductor body adjoining the first major surface spaced adjacent said first impurity region is a fifth impurity region of opposite conductivity-type from and forming a PN junction therewith said second, cathode-base region. Said fifth impurity region forms a pilot cathode-emitter region and, with second, third and fourth impurity regions, the pilot thyristor of the amplifying gate thyristor.

The amplifying gate thyristor also has cathode and anode electrodes affixed to said first and second major surfaces, respectively, to make ohmic contact with main cathode-emitter and anode-emitter regions, respectively. Although not necessarily, the cathode electrode also makes ohmic contact with the cathode-base region at cathode shunts intermittently and/or peripherally of the main cathode-emitter region. A gate electrode is also affixed on said first major surface to make ohmic contact with the cathode-base region adjacent to and spaced from the pilot cathode-emitter region along the opposite edge thereof from the main cathode-emitter region. Finally, a floating electrode is affixed on said first major surface spaced adjacent the gate and cathode electrodes to make ohmic contact with the pilot cathode-emitter region and the cathode-base region between the main and pilot cathode-emitter regions.

The amplifying gate thyristor is packaged in an encapsulation means adapted for that purpose. The encapsulation means includes a locator means for aligning and supporting a gate contact to make ohmic contact with the gate electrode of said thyristor, and for aligning and supporting a diode relative to said gate contact to make ohmic contact to said gate contact of the locator means and said floating electrode of said thyristor.

Affixed to said locator means in alignment with said gate contact, typically through a cathode electrode, is a diode that is disposed in a second semiconductor body. The diode has cathode and anode impurity regions forming a PN junction therebetween and adjoining opposed major surfaces of said second semiconductor body, respectively. The cathode region of the diode makes ohmic contact with the gate contact of the encapsulation means typically through a cathode electrode and the locator means, and the anode region of the diode makes ohmic contact with the floating electrode of the thyristor typically an anode electrode which is affixed on a major surface of said second semiconductor body and adapted to make ohmic contact with said floating electrode of the amplifying gate thyristor.

Other details, objects and advantages of the invention will become apparent as the following description of the presently preferred embodiments and presently preferred methods of performing the same proceeds.

BRIEF DESCRIPTION OF THE DRAWINGS

In the accompanying drawings, the presently preferred embodiments of the invention and presently preferred methods of performing the invention are illustrated, in which.

DESCRIPTION OF THE PREFERRED EMBODIMENTS

Figure 1:
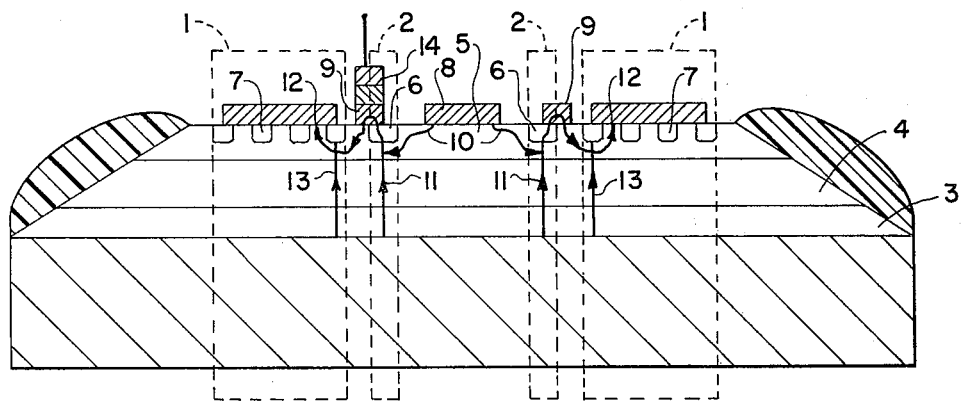
FIG. 1 is a cross-sectional view in elevation of a prior art amplifying gate thyristor with gate assist turn-off capabilities.

Referring to FIG. 1, a prior art amplifying gate thyristor with gate assist turn-off capability is shown for purposes of comparative illustration. Discussion of this prior art device can be found in the "Background of the Invention."

Figure 2:
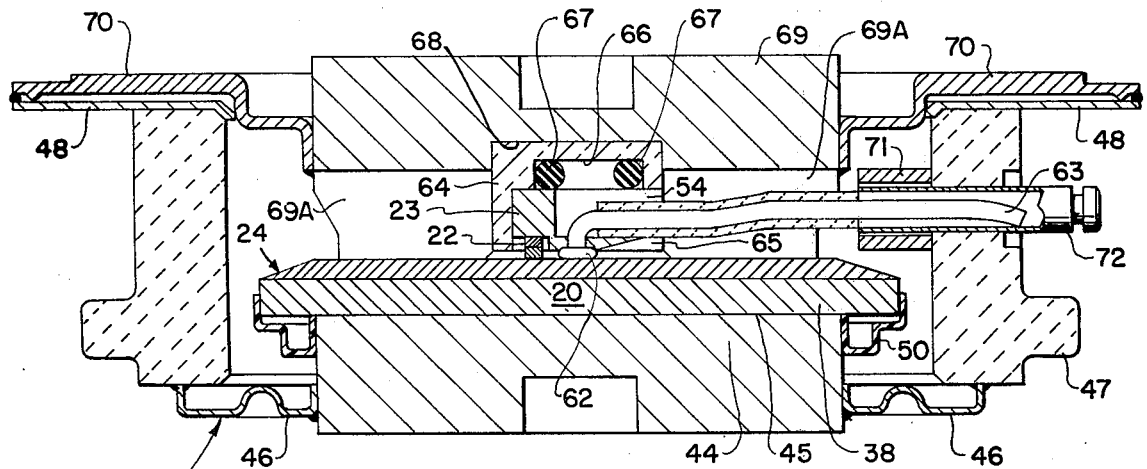
FIG. 2 is a cross-sectional view in elevation of an amplifying gate thyristor with gate assist turn-off capability of the present invention.
Figure 3:
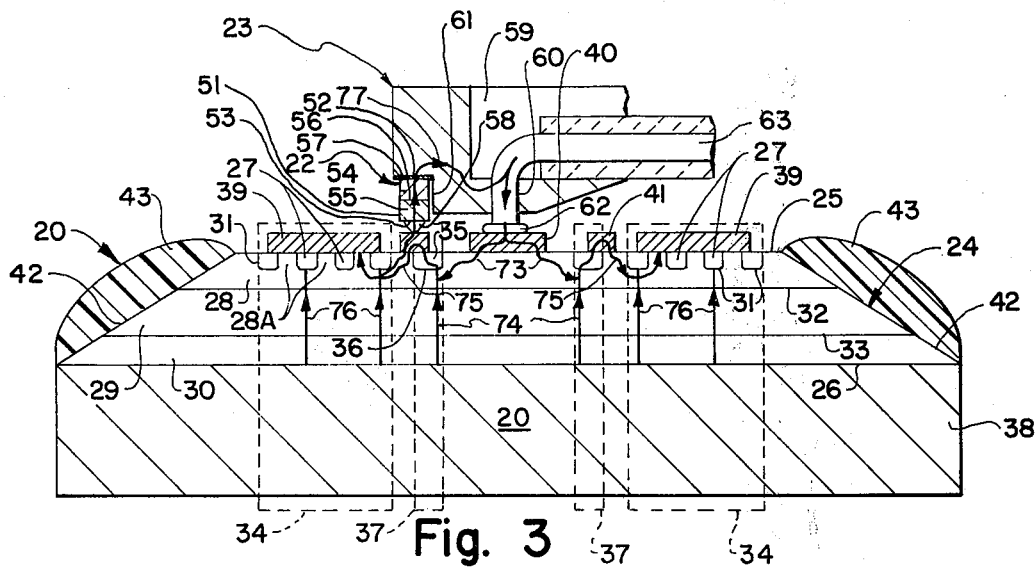
FIG. 3 is an enlarged fragmentary cross-sectional view in elevation of a portion of FIG. 2.

Referring to FIGS. 2 and 3, an amplifying gate thyristor with gate assist turn-off capability is comprised of amplifying gate thyristor 20, encapsulation means 21 adapted for packaging said amplifying gate thyristor 20, and diode 22. Encapsulation means 21 includes locator means 23 to which diode 22 is affixed to make ohmic contact with amplifying gate thyristor 20.

Amplifying gate thyristor 20 is preferably a commercially available amplifying gate thyristor such as a Westinghouse Electric T 62 J series thyristor. Amplifying gate thyristor 20 is disposed in first semiconductor body 24 having first and second opposed major surfaces 25 and 26. Semiconductor body 24 is typically a commercially available single crystal silicon wafer of circular shape having a thickness typically of about 8 to 20 mils.

Amplifying gate thyristor 20 has first, second, third and fourth impurity regions 27, 28, 29 and 30 of alternate conductivity type disposed through body 24 from first major surface 25 to second major surface 26. PN junctions 31, 32 and 33 (cathode, forward blocking and anode junctions, respectively) are thus formed between impurity regions 27 and 28, 28 and 29, and 29 and 30, respectively; and main thyristor 34 is thus formed.

Impurity regions 27 and 30 adjoin first and second major surfaces 25 and 26, respectively, to form main cathode-emitter region 27 and anode-emitter region 30 of main thyristor 34. Impurity regions 28 and 29 are disposed in body 24 adjoining main cathode-emitter region 27 and anode-emitter region 30 to form cathode-base region 28 and anode-base region 29 of main thyristor 34. Impurity region 28 also adjoins first major surface 25 centrally and peripherally around cathode-emitter region 27, and also preferably intermittently cathode-emitter region 27 to form cathode shunts (not shown).

Amplifying gate thyristor 20 also comprises fifth impurity region 35 disposed in semiconductor body 24 adjoining first major surface 25 spaced adjacent first impurity region 27 of opposite conductivity type from second impurity region 28. PN junction 36 is thus formed between second impurity region 28 and fifth impurity region 35. Pilot thyristor 37 is thus formed with cathode-base region 28, anode-base region 29, and anode-emitter region 30, which are common to main thyristor 35.

Typically, the impurity regions as above described are provided in semiconductor body 24 by a standard diffusion technique. Alternatively, the impurity regions may be provided by epitaxial growth or a combination of epitaxial growth and diffusion.

After disposition of the impurity regions as above described in semiconductor body 24, first semiconductor body 24 is disposed on anode electrode 38 with second major surface 26 of the body in contact with a major surface of the electrode. Anode electrode 38 is usually separately formed of molybdenum or tungsten in a circular shape at least as large as semiconductor body 24 and is typically 50 to 80 mils in thickness.

Anode electrode 38 is alloyed to second major surface 26 of semiconductor body 24 by heating electrode 38 and body 24 in intimate contact in an inert atmosphere such as argon to a temperature typically of about 680°C. In this way, electrode 38 makes preferably low resistance, ohmic contact with anode-emitter region 30 across the entire second major surface 26.

Amplifying gate thyristor 20 also includes cathode electrode 39, gate electrode 40 and floating electrode 41. Cathode electrode 39 is affixed on first major surface 25 to make preferably low resistance, ohmic contact with main cathode-emitter region 27, and is preferably a patterned electrode to provide for interdigitation of the floating electrode 41 in, for example, the well-known "snowflake" design. Typically, cathode electrode 39 also makes ohmic contact with cathode-base region 28 intermittent of the cathode-emitter region 27 at cathode shunts 28A, and at the outer periphery of cathode-emitter region 27 (not shown) to assist in providing rapid turn-on capability.

Gate electrode 40 is affixed on first major surface 25 to make preferably low resistance, ohmic contact with cathode-base region 28 spaced adjacent pilot cathode-emitter region 35 opposite from main cathode-emitter region 27. Floating electrode 41 is affixed on first major surface 25 spaced adjacent cathode and gate electrodes 39 and 40 to make preferably low resistance, ohmic contact with pilot cathode-emitter region 35, and cathode-base region 28 between main and pilot cathode-emitter regions 27 and 35. Floating electrode 41 is typically an inter-digitated structure, with radially extending portions inter-digitated with cathode-emitter region 27 and cathode electrode 39. The radial extensions make low resistance, ohmic contact with cathode-base region 28 spaced adjacent main cathode-emitter region 27.

Cathode, gate and floating electrodes 39, 40 and 41 may be of any suitable metal, such as aluminum, which will provide ohmic contact and preferably a low resistance, ohmic contact to semiconductor body 24. Preferably, the material for the electrode is also one, such as aluminum, which can be readily vapor or sputter deposited on the semiconductor body. Preferably, electrodes 39, 40 and 41 are vapor or sputter deposited to a thickness typically of about 50,000 to 100,000 A. Electrodes 39, 40 and 41 are preferably formed by deposition over the entire surface followed by selective removal of the deposited layer by standard photolithographic masking and etching techniques. As formed, electrodes 39, 40 and 41 typically make low resistance, ohmic contact as above described; however, sintering to achieve the lower resistance of the contact may be appropriate in certain embodiments.

Amplifying gate thyristor 20 is typically completed by lapping side surfaces 42 of semiconductor body 24 by known procedures to bevel said side surfaces to shape the electric fields in the thyristor and spin-etching to reduce edge leakage and possible localized surface breakdown during operation. Beveled side surfaces 42 are then coated with a suitable passivating layer 43. Materials particularly suitable for this purpose is 1,2-dihydroxyanthraquinone, (also called "alizarin") in combination with a silicone or epoxy resin. Passivating layer 43 substantially reduces atmospheric effects on semiconductor body 24 and, in turn, on amplifying gate thyristor 20.

Assembled amplifying gate thyristor 20 is seated in encapsulation means 21. Encapsulation means 21 is comprised of lower mounting contact 44 of, for example, nickel-plated copper having a substantially flat upper surface 45 for mating with anode electrode 38. Mounting contact 44 also has peripheral flange 46 fastened about its periphery, e.g. by welding or brazing, for mating with ceramic tubular member 47, which provides the periphery of encapsulation means 21. Attached to tubular member 47 is also a flange 48, typically of copper, for mating with upper contact member 49 of encapsulation means 21 as hereinafter described.

Amplifying gate thyristor 20 is centered and held in position on the lower mounting contact 44 by cylindrical spacer 50. Spacer 50 is mounted over the cylindrical surfaces of lower mounting contact 44 as shown, or against ceramic tubular member 47 (not shown). Spacer 50 is typically of polytetrafluoroethylene or some other good insulating material having resilience and shock resistance.

Diode 22 is in the meantime affixed to locator means 23, typically by brazing or soldering as hereafter described. Diode 22 is disposed in second semiconductor body 51, typically of single-crystal silicon, having first and second opposed major surfaces 52 and 53. Cathode and anode impurity regions 54 and 55 of opposite conductivity type adjoin first and second major surfaces 52 and 53 and extend into body 51 to form PN junction 56 therebetween. Cathode and anode regions 54 and 55 are preferably formed by standard diffusion techniques. Cathode and anode electrodes 57 and 58, preferably of aluminum, are affixed to first and second major surfaces 52 and 53, respectively, to make preferably low resistance, ohmic contact with cathode and anode impurity regions 54 and 55, respectively.

Locator means 23 is a cylindrical metal piece of, for example, molybdenum or tungsten, possibly plated with gold or the like to prevent oxidation. Locator means 23 has groove 59 extending from the periphery thereof into the central portion, with opening 60 through the center at groove 59 adapted to support a gate contact as hereinafter described. Locator means 23 also has held therein recess 61 opposite groove 59 adapted to support and align diode 22 relative to a gate contact.

Diode 22 is affixed to locator means 23 at recess 61 typically by brazing or soldering cathode electrode 57 to locator means 23. In certain instances, however, second semiconductor body 51 can be affixed directly to locator means 23 at recess 61 so that locator means 23 makes ohmic contact to cathode impurity region 54 and provides, integrally therewith, cathode electrode 57. The gate contact 62 is also positioned and formed in locator means 23 by extending a bare-end of insulated wire lead 63 through opening and bludgeoning the end of the wire lead 63 as shown in FIG. 3. The wire lead 63 is then bent into groove 59 of locator means 23 for subsequent connection through encapsulation means 21 as hereinafter described.

By this arrangement, diode 22 is supported and aligned in recess 61 of locator means 23 relative to gate contact 62. The spacing between anode electrode 58 of diode 22 and gate contact 62 is selected to correspond to the spacing between floating electrode 41 and gate electrode 42 of amplifying gate thyristor 20, while cathode electrode 57 of diode 22 makes ohmic contact with gate contact 62 through locator means 23.

Locator means 23, with diode 22 and gate contact 62 assembled therein, is slidably and frictionally mounted in insulated holder 64, with groove 65 of holder 64 corresponding to groove 59 in locator means 23 through which insulated wire lead 63 is threaded. Locator means 23 is spaced from base 66 of holder 64 by conventional O-ring 67 to provide compression, shockresistant mounting of the gate contact 62 and anode electrode 58 to gate electrode 40 and floating electrode 41, respectively, as hereinafter described.

Holder 64 is then nested in central recess 68 of upper mounting contact 69 of encapsulation means 21. Holder 64 with the above-described assembly therein may be held in recess 68 by friction mounting, adhesive bonding or any other suitable means.

Locator means 23 with diode 22 and gate contact 62 mounted therein is then positioned in encapsulation means 21 by positioning upper mounting contact 69 over the open end of ceramic tubular member 47. Upper mounting contact 69 is typically of a metal such as copper to provide for uniform thermal expansion. Upper mounting contact 69 has flange 70 fastened around its periphery, e.g. by brazing or welding, to mate with flange 48 of ceramic member 47. The free bare end of insulated lead wire 63 is threaded through groove 69A in mounting contact 69 and insulated sleeve 71 into external conduit electrode 72, which extends through the cylindrical portion of ceramic tubular member 47, to make ohmic contact herewith.

Encapsulation means 21 is then hermetically sealed with amplifying gate thyristor 20, diode 22 and locator means 23 therein, by brazing or soldering flange 70 of upper mounting contact 69 to flange 48 of ceramic member 47. After sealing, compression bonds are provided by pressure means as follows to provide low resistance ohmic contacts: lower mounting contact 44 to anode electrode 38 of amplifying gate thyristor 20, anode electrode 58 of diode 22 to floating electrode 41 of amplifying gate thyristor 20, and gate contact 62 to gate electrode 40 of amplifying gate thyristor 22 by pressure means.

Pressure means in this embodiment consists of flange 46 of lower mounting contact 44 and flange 70 of upper mounting contact 69, which are each in a generally s shape. Pressure is applied to the assembly to form the compression bonds by stressing the flanges 46 and 70 inwardly by external loading. The external pressure is applied within certain limits to establish a compression bond, i.e. low electrical resistance connection between the respective contacts and electrodes, yet not be so extreme as to cause cracking of the semiconductor bodies during later installation and operation of the device. Typically, the force exerted by the pressure means is such as to produce a pressure between 1,000 and 5,000 psi. but most desirably between 2,000 and 4,000 psi. These forces translate to a considerably higher and wider range of pressures due to the irregularities in the surface of the electrodes and contacts. Of course, the smaller the total area of physical contact between the contacts and electrodes, the greater is the pressure at the surfaces of semiconductor body 24 for a given compressive force.

The resulting assembly is an amplifying gate thyristor with gate assist turn-off capability formed simply and inexpensively utilizing a conventional amplifying gate thyristor. The invention thus totally eliminates the need for stocking of special amplifying gate thyristors to provide gate assist turn-off capability, as well as the extended and expensive manufacturing steps heretofore needed to provide such gate assisted turn-off, amplifying gate thyristor.

The operation of the assembly is shown by the arrows on FIG. 3. To turn-on, an operating voltage is applied between mounting contacts 44 and 69, and anode and cathode electrodes 38 and 39 across amplifying gate thyristor 20. The applied load voltage is such that the thyristor is in a high impedance, forward blocking state. A positive current suitable for turn-on of pilot thyristor 37 is then applied to gate electrode 40 through wire lead 63 and gate contact 62. The positive gate current causes a lateral current flow as shown by arrows 73 to forward bias cathode junction 36 of pilot thyristor 37. Forward biasing of cathode junction 36 causes carrier injection into cathode-base region 28 at pilot thyristor 37, and in turn causes pilot thyristor 37 to switch to a low impedance, conducting state, with anode current shown by arrows 74 from anode electrodes 38 into pilot cathode-emitter region 35. The anode current, in turn, flows laterally from pilot cathode-emitter region 35 through floating electrode 41, cathode-base region 28 and cathode shunts 28A located along the inner edge of main cathode-emitter region 27 to cathode electrode 39, as shown by arrows 75. This lateral anode current from pilot thyristor 37 forward biases cathode junction 31 of main thyristor 34, and causes carrier injection into cathode-base region 28 and switching of main thyristor 34 from the high impedance, blocking state to the low impedance, conducting state, with anode current shown by arrows 76.

During turn-on, gate current does not flow to floating electrode 41 through diode 22 because diode 22 is reverse biased.

On turn-off of the thyristor operated in the GATT mode (e.g. under a high frequency AC load potential above 10 KHz), the anode current is commutated to zero leaving a high carrier density in anode-base region 29. A negative gate assist current is applied to gate contact 62 and to diode 22 through locator means 23 as the forward load voltage is reapplied. PN junction 56 of diode 22 is forward biased by the negative gate assist current, and a lateral current is, in turn, caused to flow from cathode electrode 39 through cathode shunts 28A, cathode-base region 28, floating electrode 41, diode 22 and locator means 23 to wire lead 63 as shown by arrows 77. Such lateral current tends to reverse bias cathode junction 31 and counteracts the current distribution present in cathode-base region 28 that tends to forward bias cathode junction 31. The gate assist thereby reduces the likelihood that a reapplied forward voltage will fire the device, and the forward voltage can be reapplied within a shorter time period after commutation of the anode load current to zero — by definition reducing the "turn-off time" of the device.

To turn-off the thyristor operated in the GCS mode (e.g. under a low frequency AC or DC load voltage), a negative gate current is applied to gate contact 62 and to diode 22 through locator means 23, while the load voltage remains applied between anode and cathode electrodes 38 and 39. The negative gate current forward biases PN junction 56 of diode 22, causing lateral current flow as shown by arrow 77 from cathode electrode 38 through cathode shunts 28A, cathode-base region 28, floating electrode 41, diode 22 and locator means 23 to wire lead 63. The voltage on cathode junction 31 is thus reduced to below about 0.7 volt and the internal feedback mechanism within the equivalent transistor structures of the main thyristor interrupted. The high impedance blocking state is thus reestablished in main thyristor 34, while the load voltage still remains applied to the device.

While the presently preferred embodiments of the invention and methods of making and utilizing them have been specifically described, it is distinctly understood that the invention may be otherwise embodied and used within the scope of the following claims.

What is claimed is:

1. An amplifying gate thyristor with gate assist turn-off capability comprising:
   A. an amplifying gate thyristor disposed in a first semiconductor body having first and second major surfaces, said thyristor comprising (1) first, second, third and fourth impurity regions of alternate conductivity-type disposed through the body from said first major surface to said second major surface to form PN junctions between adjacent regions and main cathode-emitter, cathode-base, anode-base and anode-emitter regions, respectively; (2) fifth impurity region disposed in said semiconductor body adjoining said first major surface spaced adjacent said first impurity region to form a PN junction with said second impurity region and a pilot cathode-emitter region; (3) cathode and anode electrodes affixed to said first and second major surfaces, respectively, to make ohmic contact with the main cathode-emitter region and the anode-emitter region, respectively; (4) gate electrode affixed on said first major surface to make ohmic contact with the cathode-base region adjacent to and spaced from the pilot cathode-emitter region opposite from the main cathode-emitter region; and (5) floating electrode affixed on said first major surface spaced adjacent the gate and cathode electrodes to make ohmic contact with the pilot cathode-emitter region and the cathode-base region between the main and pilot cathode-emitter regions;
   B. an encapsulation means adapted for packaging said amplifying gate thyristor therein, said encapsulation means including a locator means for aligning and supporting a gate contact to make ohmic contact with said gate electrode of said thyristor, and adapted to support and align a diode relative to said gate electrode to make ohmic contact to said gate contact of the locator means and said floating electrode of said thyristor; and
   C. a diode disposed in a second semiconductor body and having cathode and anode impurity regions forming a PN junction therebetween and adjoining opposed major surfaces of said second semiconductor body, respectively, said diode affixed to said locator means in said encapsulation means in alignment with said gate contact, said cathode region thereof making ohmic contact with said gate contact of said encapsulation means, and said anode region thereof making ohmic contact with an anode electrode affixed on a major surface of said second semiconductor body and adapted to make ohmic contact with the floating electrode of said thyristor.

2. A package assembly for an amplifying gate thyristor adapted to provide gate assist turn-off capability comprising:
   A. encapsulation means adapted for packaging therein an amplifying gate thyristor, said encapsulation means including a locator means for aligning and supporting a gate contact adapted to make ohmic contact with a gate electrode of an amplifying gate thyristor, and adapted to support and align a diode relative to said gate electrode in ohmic contact with said gate electrode; and B. a diode disposed in a semiconductor body and having cathode and anode regions forming a PN junction therebetween and adjoining opposed major surfaces of said semiconductor body, respectively, said diode fastened to said locator means in alignment with said gate contact, and cathode region thereof making ohmic contact with an anode electrode affixed on a major surface of said semiconductor body and adapted to make ohmic contact with a floating electrode of an amplifying gate thyristor.

* * * * *